US010014396B2

(12) United States Patent
Chang et al.

(10) Patent No.: US 10,014,396 B2
(45) Date of Patent: Jul. 3, 2018

(54) SPIN CONTROL ELECTRONIC DEVICE OPERABLE AT ROOM TEMPERATURE

(71) Applicant: Korea Institute of Science and Technology, Seoul (KR)

(72) Inventors: Joon Yeon Chang, Seoul (KR); Tae Eon Park, Seoul (KR); Byoung Chul Min, Seoul (KR); Hyun Cheol Koo, Seoul (KR); Suk Hee Han, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/487,695

(22) Filed: Apr. 14, 2017

(65) Prior Publication Data

US 2017/0301778 A1 Oct. 19, 2017

(30) Foreign Application Priority Data

Apr. 14, 2016 (KR) ........................ 10-2016-0045820

(51) Int. Cl.
*H01L 29/47* (2006.01)
*H01L 43/02* (2006.01)
*H01L 29/66* (2006.01)
*H01L 29/06* (2006.01)

(52) U.S. Cl.
CPC .... *H01L 29/66984* (2013.01); *H01L 29/0673* (2013.01); *H01L 29/47* (2013.01)

(58) Field of Classification Search
CPC ............... H01L 29/66; H01L 29/66984; H01L 29/0673; H01L 29/47; H01L 43/02; H01L 43/08; H01L 43/10; H01L 43/12
See application file for complete search history.

(56) References Cited

U.S. PATENT DOCUMENTS

| 2007/0059877 A1* | 3/2007 | Koo | H01F 10/193 438/213 |
|---|---|---|---|
| 2008/0308844 A1* | 12/2008 | Koo | G11C 11/16 257/192 |
| 2009/0008689 A1* | 1/2009 | Koo | H01L 29/66984 257/295 |
| 2011/0279146 A1* | 11/2011 | Koo | B82Y 10/00 326/100 |
| 2012/0211848 A1* | 8/2012 | Sasaki | H01L 43/08 257/422 |
| 2013/0140606 A1* | 6/2013 | Koo | H01L 29/66984 257/195 |
| 2013/0200446 A1* | 8/2013 | Wunderlich | H01L 29/82 257/295 |

(Continued)

*Primary Examiner* — Fazli Erdem
(74) *Attorney, Agent, or Firm* — NSIP Law

(57) ABSTRACT

A spin control electronic device operable at room temperature according to an embodiment of the present invention includes a transfer channel that includes a low-dimensional nanostructure, the nanostructure being located on a substrate, having an elongate shape in a first direction and having a cross section, cut along a second direction that is perpendicular to the first direction, in the shape of a triangle; a source electrode located on the substrate and intersecting the transfer channel, the source electrode covering part of the transfer channel; and a drain electrode spaced apart from the source electrode on the substrate, the drain electrode intersecting the transfer channel and covering part of the transfer channel.

15 Claims, 5 Drawing Sheets

(56) References Cited

U.S. PATENT DOCUMENTS

2015/0200282 A1* 7/2015 Hirohata ........... H01L 29/66984
  257/194
2015/0311428 A1* 10/2015 Hirohata ........... H01L 29/66984
  257/421
2016/0284982 A1* 9/2016 Sasaki ................. G01R 33/098

* cited by examiner

SPIN CONTROL ELECTRONIC DEVICE OPERABLE AT ROOM TEMPERATURE

CROSS-REFERENCE TO RELATED APPLICATION

This application claims the benefit of Korean Patent Application No. 10-2016-0045820, filed on Apr. 14, 2016, in the Korean Intellectual Property Office, the disclosure of which is incorporated herein in its entirety by reference.

TECHNICAL FIELD

A spin control electronic device operable at room temperature is provided.

BACKGROUND

Silicon-based semiconductor devices are faced with the limitations of physical and nano-processing technology that cannot make them smaller anymore, due to continuously increased integration. Accordingly, development of a new electronic device is strongly required.

Spintronic devices that use both physical and electrical properties of electrons, i.e. electric charge and spin, are attracting much attention as next generation semiconductor devices, and a spin field effect transistor (hereinafter, a spin FET) that can change the resistance of devices according to the spin direction of actual electrons has recently been developed.

The spin FET has the same structure as the conventional silicon-based transistor (MOSFET) except that the source electrode and the drain electrode are made of a ferromagnetic material, and has advantages that it has a high operating speed and low power consumption because the resistance is changed by adjusting the spin direction.

The operating principle of the spin FET is that spin electrons polarized at the source electrode are injected into the transfer channel and the spin direction of the electrons moving in the transfer channel is controlled. The magnetization directions of the source and drain electrodes in response to an external magnetic field are fixed and the spin direction of the electrons injected into the transfer channel is controlled to be parallel or antiparallel using the electric field of the gate electrode. Here, if the spin direction of the electrons arriving at the drain electrode is parallel to the magnetization direction of the drain electrode, the resistance is low, and if it is antiparallel, the resistance is high.

Conventional spin FETs are currently operable only at extremely low temperatures below about 77K, due to their extremely low spin electron injection rates, short spin relaxation distances, high interface resistances between the source and drain electrodes and the channel, and a high signal to noise ratio.

DETAILED DESCRIPTION OF THE INVENTION

Technical Problem

The spin control electronic device operable at room temperature according to an embodiment of the present invention is for improving the injection rate of spin electrons from the source electrode to the transfer channel and the injection rate of spin electrons from the transfer channel to the drain electrode.

The spin control electronic device operable at room temperature according to an embodiment of the present invention is for reducing the interfacial resistance between the source and drain electrodes and the transfer channel.

The spin control electronic device operable at room temperature according to an embodiment of the present invention is intended to be operable at room temperature.

Embodiments according to the present invention can be used to accomplish tasks that are not specifically mentioned other than the above-described tasks.

Technical Solution

A spin control electronic device operable at room temperature according to an embodiment of the present invention includes a transfer channel that includes a low-dimensional nanostructure, the nanostructure being located on a substrate, having an elongate shape in a first direction and having a cross section, cut along a second direction that is perpendicular to the first direction, in the shape of a triangle; a source electrode located on the substrate and intersecting the transfer channel, the source electrode covering part of the transfer channel; and a drain electrode spaced apart from the source electrode on the substrate, the drain electrode intersecting the transfer channel and covering part of the transfer channel.

Here, electrons spin-polarized at the source electrode are injected into the transfer channel, the spin-polarized electrons reach the drain electrode through the transfer channel, and resistance differs depending on the angle the magnetization direction of the spin-polarized electrons forms with the magnetization direction of the drain electrode.

The device may further include an input electrode disposed on the opposite side of the drain electrode with respect to the source electrode on the substrate, intersecting the transfer channel and covering part of the transfer channel; and an output electrode disposed on the opposite side of the source electrode with respect to the drain electrode on the substrate, intersecting the transfer channel and covering part of the transfer channel.

The low-dimensional nanostructure may be a nanowire including comprising at least one of a Group IV semiconductor, a Group III-V compound semiconductor, a metal, and a half metal, or may be a graphite-based nanostructure including carbon nanotubes or graphene.

The length of the transfer channel in the second direction may be 10 nm to 1000 nm.

The transfer channel may include two {112} crystal planes and one {001} crystal plane.

The spin injection rate at the {112} crystal planes of the transfer channel may be larger than the spin injection rate at the {001} crystal plane of the transfer channel.

The device may further include an insulating film located between the source electrode and the transfer channel and between the drain electrode and the transfer channel, respectively.

The insulating film may include one or more of $Al_2O_3$, MgO, TaOx, and $SiO_2$, and the thickness of the insulating film may be 0.5 nm to 3.0 nm.

Each of the source electrode and the drain electrode may include at least one ferromagnetic material selected from the group consisting of CoFe, Co, CoFeB, Ni, NiFe, GaMnAs, InMnAs, GeMn, GaMnN, GaMnP, and ZnMnO, or one half metal selected from $La_{(1-x)}Sr_xMnO_3$(LSMO) and $CrO_2$, or a Pd/CoFe multi-layer structure or a Pt/CoPt multi-layer structure.

Each of the source electrode and the drain electrode may have a rectangular shape, and the length of the source electrode in the second direction may be longer than the length in the first direction and the length of the drain electrode in the second direction may be longer than the length in the first direction.

A length of the portion of the source electrode overlapping the transfer channel in the first direction may be longer than a length in the second direction, and a length of the portion of the drain electrode overlapping the transfer channel in the first direction may be longer than a length in the second direction.

When an external magnetic field is applied to the spin control electronic device operable at room temperature, the magnetization direction of the portion of the source electrode overlapping the transfer channel may not be parallel to the direction of the external magnetic field.

A distance between the source electrode and the drain electrode in the first direction is 10 nm to 5 µm.

Advantageous Effects

The spin control electronic device operable at room temperature according to an embodiment of the present invention is capable of improving the injection rate of spin electrons from the source electrode to the transfer channel and the injection rate of spin electrons from the transfer channel to the drain electrode, reducing the interfacial resistance between the source and drain electrodes and the transfer channel, and being operable at room temperature.

EXPLANATION OF REFERENCE NUMERALS

Figure 1:
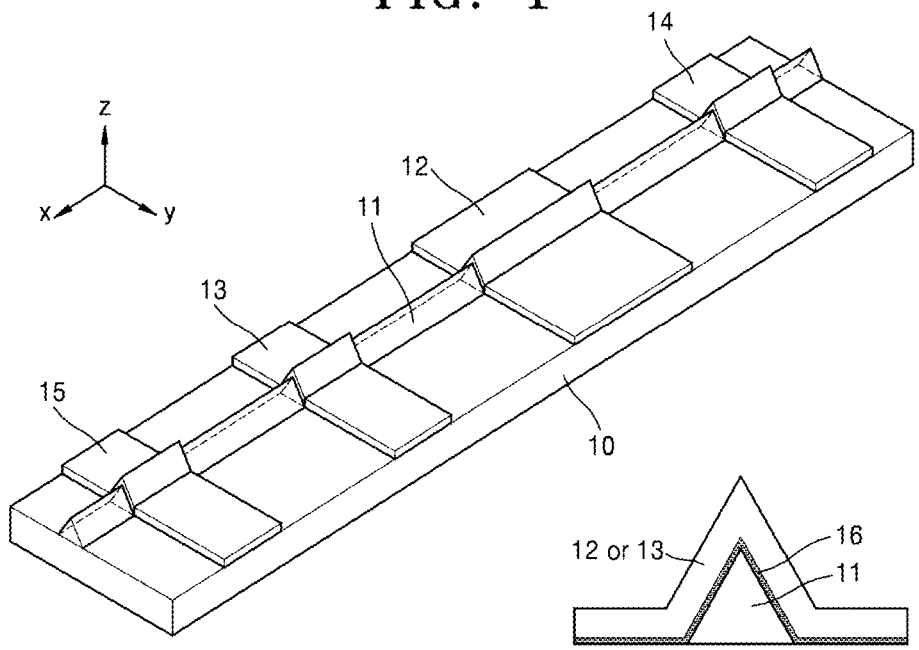
FIG. 1 is a perspective view of a spin control electronic device operable at room temperature according to an embodiment.

10: substrate 11: transfer channel
12: source electrode 13: drain electrode
14: input electrode 15: output electrode
16: insulating film Mode of the Invention Embodiments of the present invention will now be described in detail with reference to the attached drawings such that a person of ordinary skill in the art can easily make and use the invention. The present invention may be embodied in many different forms and is not limited to the embodiments described herein. In order to clearly illustrate the present invention, parts that are not related to the description are omitted, and the same reference numerals are used for the same or similar components throughout the specification. A detailed description of prior arts well known to the public will be omitted.

In the drawings, the thicknesses are enlarged to clearly indicate layers and regions. When a part such as a layer, film, region, plate, or the like is referred to as being "on" another part, it includes not only the case of being directly on another part but also the case of having yet another part in between. On the other hand, when a part such as a layer, film, region, plate, or the like is referred to as being "under" another part, it includes not only the case of being directly under another part but also the case of having yet another part in between. Meanwhile, when a part is "directly under" another part, it means that there is no other part in between.

Throughout the specification, when a component is referred to as "comprising" certain components, it means that the component may include other components as well, without excluding other components unless specifically stated otherwise.

Hereinafter, a spin control electronic device operable at room temperature (lateral spin device) according to an embodiment of the present invention will be described. In the specification, the spintronic device may be a spin valve device, a spin FET, or a spin memory device. Also, the first direction may be the x-axis direction shown in the drawings, and the second direction may be the y-axis direction shown in the drawings.

FIG. 1 is a perspective view of a spin control electronic device operable at room temperature according to an embodiment.

Referring to FIG. 1, a spin control electronic device operable at room temperature according to an embodiment includes a transfer channel 11 that includes a low-dimensional nanostructure that is disposed on a substrate 10, has an elongate shape in a first direction and has a cross section cut along a second direction that is perpendicular to the first direction in the shape of a triangle, a source electrode 12 that is disposed on the substrate 10, intersects the transfer channel 11 and covers part of the transfer channel 11, and a drain electrode 13 that is spaced apart from the source electrode 12 on the substrate 10, intersects the transfer channel 11 and covers part of the transfer channel 11.

Here, the substrate 10 may include, for example, Si.

The low-dimensional nanostructure may be a nanowire including at least one of a Group IV semiconductor, a Group III-V compound semiconductor, a metal, and a half metal. The Group IV semiconductor may be, for example, Si or Ge. The Group III-V compound semiconductor may be GaN, AlN, InGaN, GaAs, InAs, InSb and GaInAs, and the metal may be, for example, at least one of Au, Pt, Ag, Al, Cu, and Sb.

In addition, the low-dimensional nanostructure may be a graphite-based nanostructure including carbon nanotubes or graphene.

The transfer channel 11 including the above-described low-dimensional nanostructure may have a long shape in the first direction (x-axis direction). The length of the transfer channel 11 in the first direction in a spintronic device can be very long as compared with the length (width) in the second direction (y-axis direction). The length (width) of the transfer channel 11 in the second direction may be about 10 nm to about 1000 nm. The transfer efficiency of the spin electrons can be greatly improved within this range.

The cross section of the transfer channel 11 cut along the second direction may have, for example, a triangular shape. Here, the transfer channel may include two {112} crystal planes and one {001} crystal plane. The crystal plane referred to in the present specification is expressed as Miller's indices.

Since the transfer channel 11 has a triangular cross section, the spintronic device according to the embodiments has improved characteristics such as a greatly improved spin injection rate, an improved operation speed, and reduced power consumption, and the spintronic device can operate at room temperature (about 25° C.).

The source electrode 12 is an input portion for injecting polarized electrons into the transfer channel 11, intersects with the transfer channel 11, and may cover part of the transfer channel 11.

The source electrode 12 may include at least one ferromagnetic material selected from the group consisting of CoFe, Co, CoFeB, Ni, NiFe, GaMnAs, InMnAs, GeMn, GaMnN, GaMnP, and ZnMnO, or a half metal such as $La_{(1-x)}Sr_xMnO_3$(LSMO) or $CrO_2$, which shows a 100% spin polarization, or a Pd/CoFe multi-layer structure or a Pt/CoPt multi-layer structure having perpendicular magnetization.

The length of the source electrode 12 in the second direction may be long in the first direction. Due to such a length-to-width ratio (aspect ratio), the portion of the source electrode 12 that does not overlap the transfer channel 11 may have a magnetic moment parallel to the applied magnetic field.

When the transfer channel 11 is formed of a low-dimensional nanostructure of a nanowire or graphite-based nanostructure, the spin injection efficiency can be reduced due to a mismatch between the inherent conductivity of the source electrode 12 including the magnetic material and the inherent conductivity of the transfer channel 11.

In order to minimize such a decrease in the spin injection rate, an insulating film 16 may be additionally provided between the transfer channel 11 and the source electrode 12. The insulating film 16 may, for example, include one or more of $Al_2O_3$, MgO, TaOx, and $SiO_2$, and may function as a Schottky barrier or a tunneling barrier. Furthermore, the interfacial resistance between the transfer channel 11 and the source electrode 12 can be reduced and electrons polarized from the source electrode 12 can be injected into the transfer channel 11 more easily.

The thickness of the insulating film 16 may have a thickness of about 0.5 nm to about 3 nm. The spin injection rate can be further improved within this range.

The drain electrode 13 receives electrons from the transfer channel 11 and outputs a voltage according to the spin direction of the electrons. The drain electrode 13 may include at least one ferromagnetic material selected from the group consisting of CoFe, Co, CoFeB, Ni, NiFe, GaMnAs, InMnAs, GeMn, GaMnN, GaMnP, and ZnMnO, or a half metal such as $La_{(1-x)}Sr_xMnO_3$(LSMO) or $CrO_2$, which shows a 100% spin polarization, or a Pd/CoFe multi-layer structure or a Pt/CoPt multi-layer structure having perpendicular magnetization.

The length of the drain electrode 13 in the second direction may be long in the first direction.

In order to minimize a decrease in spin injection efficiency that may occur due to a mismatch between the inherent conductivity of the drain electrode 13 including a magnetic body and the inherent conductivity of the transfer channel 11, an insulating film 16 may be additionally disposed between the transfer channel 11 and the drain electrode 13. The insulating film 16 may, for example, include at least one of $Al_2O_3$, MgO, TaOx, and $SiO_2$. Therefore, the interfacial resistance between the transfer channel 11 and the drain electrode 13 may decrease, and spin electrons can be injected into the drain electrode 13 more easily. Furthermore, the thickness of the insulating film 16 may have a thickness of about 0.5 nm to about 3 nm, and within this range the spin injection rate may be further improved, the operation speed may be improved, and the power consumption may be reduced.

Each of the source electrode 12 and the drain electrode 13 may have a rectangular shape. For example, the length of the source electrode 12 in the second direction (y-axis direction) may be longer than the length in the first direction (x-axis direction) and the length of the drain electrode 13 in the second direction may be longer than the length in the first direction. It is possible to make the coercive forces of the two electrodes 12 and 13 different from each other by designing the length-to-width ratio (aspect ratio) of the source electrode 12 and the length-to-width ratio of the drain electrode 13 different. In addition to shape anisotropy due to such a length-to-width ratio, the coercive force can be adjusted by adjusting the thicknesses of the source electrode 12 and the drain electrode 13.

Figure 2:
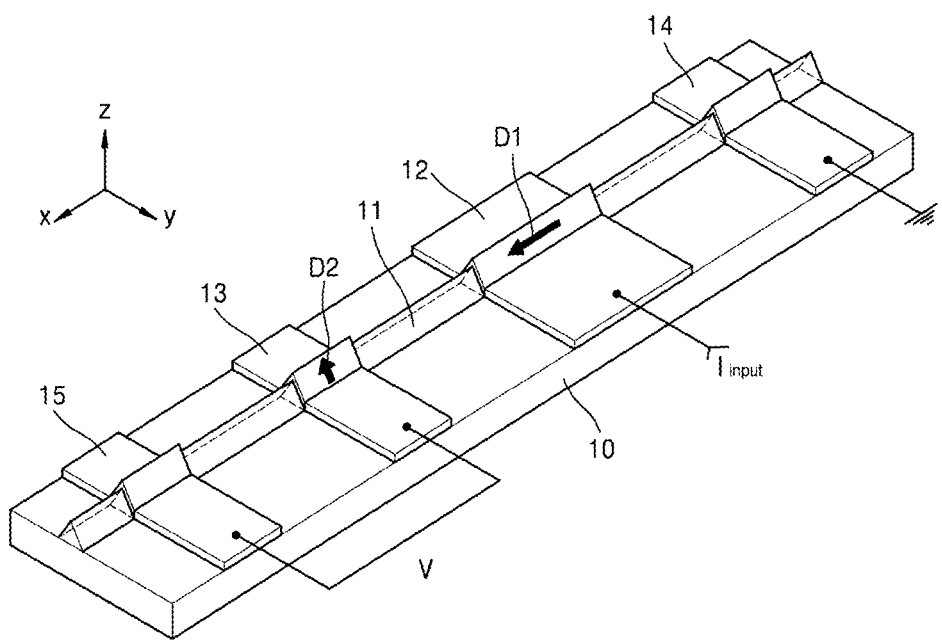
FIG. 2 is a view showing the magnetization directions of a source electrode and a drain electrode when an external magnetic field is applied to the spin control electronic device operable at room temperature according to an embodiment.

FIG. 2 is a view showing the magnetization directions of a source electrode and a drain electrode when an external magnetic field is applied to the spin control electronic device operable at room temperature according to an embodiment. More particularly, FIG. 2 shows the magnetization direction D1 of the portion of the source electrode 12 overlapping the transfer channel 11 and the magnetization direction D2 of the portion of the drain electrode 13 overlapping the transfer channel 11 in the case where an external magnetic field is applied to the spintronic device in the second direction (y-axis).

Figure 3:
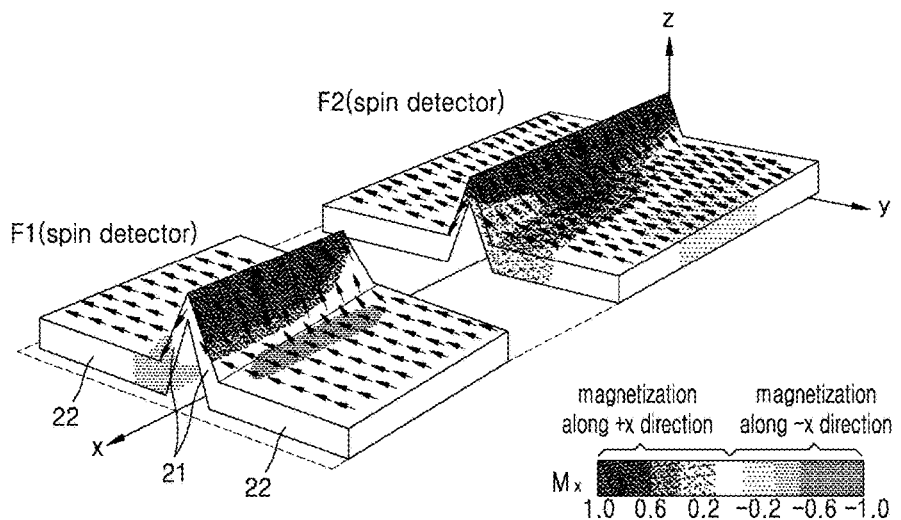
FIG. 3 is a view showing the calculated magnetization directions of a source electrode and a drain electrode when an external magnetic field that is parallel to the y-axis is applied to the spin control electronic device operable at room temperature according to an embodiment.

FIG. 3 is a view showing the calculated magnetization directions of a source electrode and a drain electrode when an external magnetic field that is parallel to the y-axis is applied to the spin control electronic device operable at room temperature according to an embodiment. The magnetization directions in FIG. 3 have been calculated using the OOMFF simulation method which is capable of predicting the micromagnetization characteristics. The magnetization direction aligned along the first direction (positive x-axis direction) and the magnetization direction along the negative first direction (negative x-axis direction) are indicated, respectively, in FIG. 3.

Referring to FIGS. 2 and 3, the source electrode 12 and the drain electrode 13 are made narrow in the first direction (x-axis direction) and long in the second direction (y-axis direction), thereby having a shape anisotropy due to a length-to-width ratio. Therefore, when an external magnetic field in the y-axis direction is applied, the magnetization direction is supposed to be aligned in the y-axis direction which is the magnetic easy axis, but the magnetization in the x-axis direction such as D1 was observed by the actual measurement. In other words, the direction of D1 and the direction of D2 are not parallel (0°) or antiparallel (180°) but perpendicular (90°), which is a unique magnetization structure that is not observed in conventional spintronic devices. Meanwhile, D1 denotes the magnetization direction of the portion of the source electrode 12 overlapping the transfer channel 11 and D2 denotes the magnetization direction of the portion of the drain electrode 13 overlapping the transfer channel 11. It should be noted that D1 and D2 do not represent the magnetization directions of the portions that do not overlap the transfer channel 11.

The source electrode 12 may be divided into a portion 21 that is in contact with and on the transfer channel 11 including a nanostructure having a triangular cross section and a portion 22 that is on the flat substrate 10, and the drain electrode 13 may also be divided into a portion 21 that is in contact with and on the transfer channel 11 and a portion 22 that is on the flat substrate 10.

The portion 21 of the source/drain electrode on the transfer channel 11 may have a magnetic direction aligned in the x-axis direction despite the magnetic field in the y-axis direction and the flat portion 22 of the source/drain electrode may have a magnetic moment parallel to the applied magnetic field due to magnetic anisotropy.

Unlike the flat portion 22, the portion 21 of the source/drain electrode formed on the transfer channel 11 having a triangular cross section cut along the y-axis direction has a shape anisotropy along the first direction (x-axis direction), thereby having a magnetization direction in the first direction (x-axis direction) under a magnetic field applied in the second direction (y-axis direction). Both the source electrode 12 and the drain electrode 13 have a longer length in the second direction than the length in the first direction, but the portion 21 of the source electrode 12 and the drain electrode 13 covering the transfer channel 11 has a longer length in the first direction than the length in the second direction. Due to such magnetization characteristics, it is possible to have a voltage characteristic different from that of a flat conventional spintronic device, and to be able to operate even at room temperature.

In the case of conventional spintronic devices, a flat semiconductor thin film is included as a transfer channel, source/drain electrode is flat, and the crystal plane where the electrode and the transfer channel are in contact are all the same. On the other hand, in the case of the spintronic device according to the embodiments, since the transfer channel 11 including the nanostructure having the triangular cross section is used, the shape of the source/drain electrode 12 and 13 is not flat and the crystal planes of the transfer channel 11 in contact with the source/drain electrodes 12 and 13 are different from each other, thereby generating a spin signal different from that of the conventional spintronic devices.

The area of a spin control electronic device operable at room temperature may be about 30 µm$^2$ to about 400 µm$^2$, and the spin injection rate of the spintronic device at room temperature may be about 10% or more. Therefore, it is suitable for small devices and operable at room temperature.

The spin control electronic device operable at room temperature may include an input electrode 14 that is disposed on the opposite side of the drain electrode 13 with respect to the source electrode 12 on the substrate 10, intersects the transfer channel 11 and covers part of the transfer channel 11, and an output electrode 15 that is disposed on the opposite side of the source electrode 12 with respect to the drain electrode 13 on the substrate 10, intersects with the transfer channel 11 and covers part of the transfer channel 11.

An example of a measurement method of spin control electronic device operable at room temperature is described. Electric current flows from the input electrode 14 to the source electrode 12 and the electrons that are spin-polarized along the same magnetization direction as the magnetization direction D1 of the source electrode 12 are injected into the transfer channel 11. On the other hand, charge electrons having a magnetization direction opposite to the magnetization direction D1 of the source electrode 12 are diffused to the input electrode 14 according to the circuit configuration. The spin electrons move equally in the direction of the drain electrode 13 and the direction of the input electrode 14 about the source electrode 12 by spin diffusion. Such a circuit connection method is called a non-local method.

The spin electrons injected into the transfer channel 11 are diffused toward the drain electrode 13 and output a voltage difference according to the correlation with the magnetization direction D2 of the drain electrode 13. The resistance differs depending on the angle the magnetization direction of the spin electrons forms with the magnetization direction D2 of the drain electrode 13 and the output electrode 15 is able to measure the resistance. For example, the magnitude of the resistance or voltage measured when the magnetization direction of the spin electrons is parallel (0°) to the magnetization direction of the drain electrode 13 may be low, and the resistance or voltage may be high when antiparallel (180°) or perpendicular (90°).

The distance between the source electrode 12 and the drain electrode 13 in the first direction may be 10 nm to 5 µm. Within this range, the device may have improved characteristics such as a greatly improved spin injection rate, an improved operation speed, reduced power consumption, etc.

Hereinafter, the spintronic device is a non-local spin valve, the transfer channel 11 of the spintronic device includes a single crystal GaN having a cross section in the shape of a triangle, one side of which has a length of about 80 nm, and the source/drain electrodes 12 and 13 may include a ferromagnetic material of CoFeB.

Figure 4:
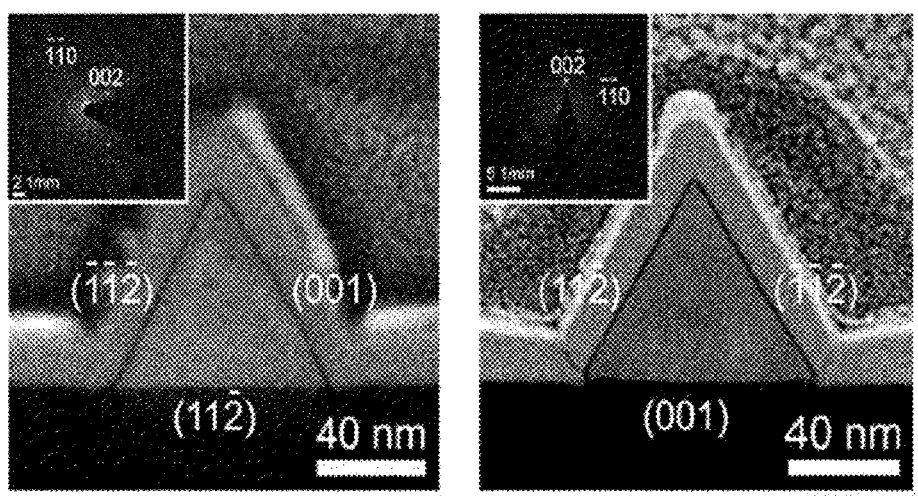
FIG. 4 shows Transmission Electron Microscopy (TEM) images illustrating the cross sections of a transfer channel of the spin control electronic device operable at room temperature according to an embodiment.

FIG. 4 shows Transmission Electron Microscopy (TEM) images illustrating the cross sections of a transfer channel of the spin control electronic device operable at room temperature according to an embodiment. The TEM images are photographs of the parts where the GaN transfer channel 11 overlaps the electrodes 12 and 13. Here, the cross section of the transfer channel 11 in the second direction is triangular, and the transfer channel 11 includes two {112} crystal planes and one {001} crystal plane.

Referring to FIG. 4, the spin control electronic device operable at room temperature may be categorized into two types of devices depending on the contact crystal planes of the electrodes 12 and 13 and the transfer channel 11.

In the image on the left, the {112} and {001} planes of the GaN transfer channel 11 are in contact with the electrodes 12 and 13, and this is classified as a Type-I device. In the image on the right, two {112} planes are in contact with the electrodes 12 and 13, and this is classified into a Type-II device.

The spin injection rate at the {112} crystal plane of the transfer channel may be larger than the spin injection rate at the {001} crystal plane of the transfer channel. As a result, the spin injection rate in the Type-II device in which two {112} planes are in contact with the electrodes 12 and 13 may be larger than the spin injection rate in the Type-I device.

Figure 5:
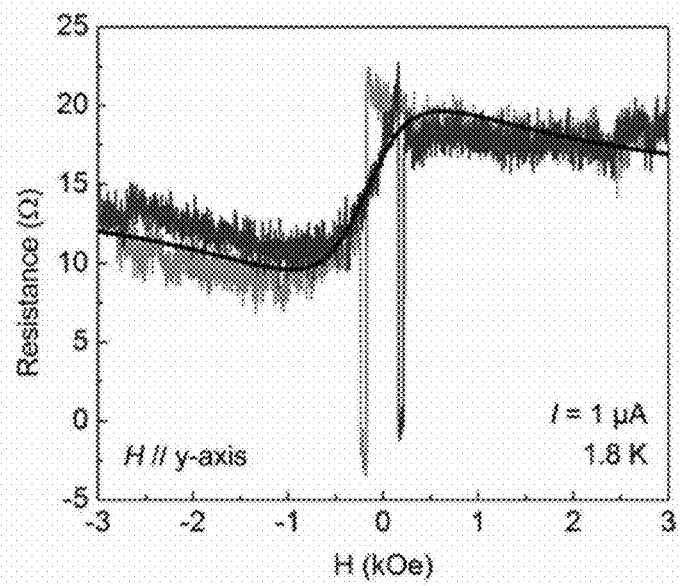
FIG. 5 is a graph showing a voltage signal measured while applying an external magnetic field of ±3 kOe in the y-axis direction in spin control electronic device operable at room temperature according to an embodiment.

FIG. 5 is a graph showing a voltage signal measured n while applying an external magnetic field of ±3 kOe in the magnetic easy axis direction (the y-axis direction) in a spin control electronic device operable at room temperature according to an embodiment.

The change in the voltage measured in a non-contact manner reflects the angle the local magnetization directions D1 and D2 of the source/drain electrodes 12 and 13 form. Thus, based on the measured voltage, the local magnetization directions D1 and D2 of the source/drain electrodes 12 and 13 on the x-z plane, which is perpendicular to the y-axis direction, can be deduced.

For example, the magnitude of the resistance or voltage measured when the magnetization directions of two magnetic bodies (source/drain electrodes) are parallel may be low, and the resistance or voltage may be high in the shape of a peak when antiparallel or 90 degrees.

In a conventional spintronic device using a thin film, a base voltage (a curve denoted by a solid line in the drawing) in addition to the peak voltage has a constant value of 0 V regardless of the magnitude of the external magnetic field, whereas the spintronic device according to the embodiment shows significantly different shapes of base voltages. This is a result of the fact that the spin injection rate differs depending on the change in the local magnetization direction of the two magnetic bodies in contact with the transfer channel 11 and the size of the crystal plane of the transfer channel 11.

As shown in FIG. 5, it is observed that the magnitude of the measured voltage continuously changes. This can be explained by the Hanle effect. The Hanle effect means that the spin-polarized electrons having the same magnetization direction as the magnetization direction D1 of the source electrode 12 are subjected to spin precessional motion by an external magnetic field perpendicular to the spin direction, and the magnitude of the voltage (or resistance) measured may change due to the spin precessional motion.

Figure 6:
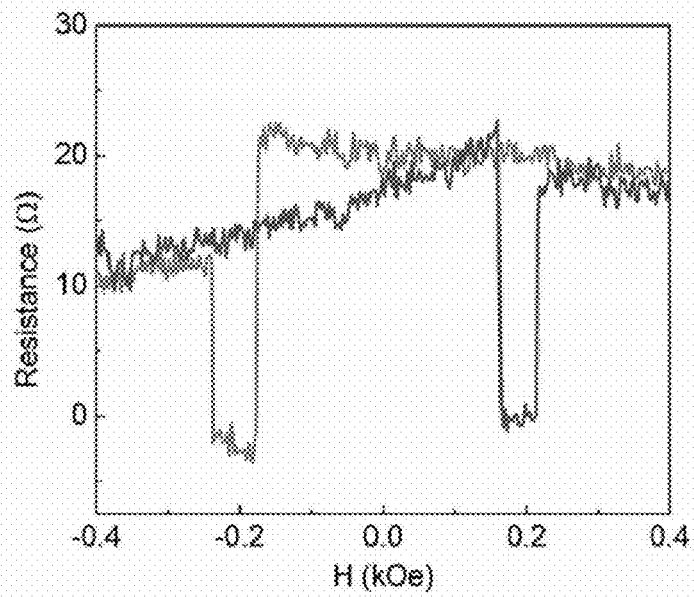
FIG. 6 is an enlarged graph showing the low magnetic field region (±0.15 kOe to ±0.25 kOe) in FIG. 5.

FIG. 6 is an enlarged graph showing the low magnetic field region (±0.15 k0e to ±0.25 k0e) in which magnetization inversion occurs in the two magnetic bodies (source/drain electrodes) in FIG. 5. It is observed that the magnetization direction of the two magnetic bodies 12 and 13 is switched from parallel to antiparallel or from antiparallel to parallel, and rapid changes in voltage (dented portion) occur. Conversely, the change in the magnetization state of the source/drain electrodes 12 and 13 can be known from this rapid change in voltage, and the magnetization state of the source/drain electrodes 12 and 13 can be controlled through adjustment of the external magnetic field.

Figure 7:
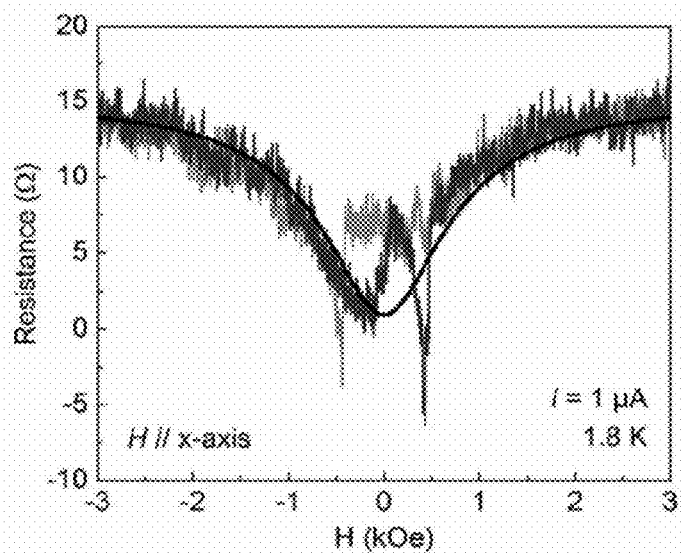
FIG. 7 is a graph showing a voltage signal measured in the spintronic device to which a magnetic field in the x-axis direction is applied.

FIG. 7 is a graph showing a voltage signal measured in the spintronic device to which a magnetic field in the x-axis direction is applied. Here, the Type-I spintronic device is the one described in the part related to FIG. 4.

The curve of the base voltage (indicated by a bold solid line) in FIG. 7 shows a different profile than the base voltage curve under a magnetic field applied in the y-axis of FIG. 5 as the direction of the applied magnetic field changes, and shows the peak voltage due to the change in magnetization conversion behavior of the source/drain electrodes 12 and 13 also has a different profile.

Figure 8:
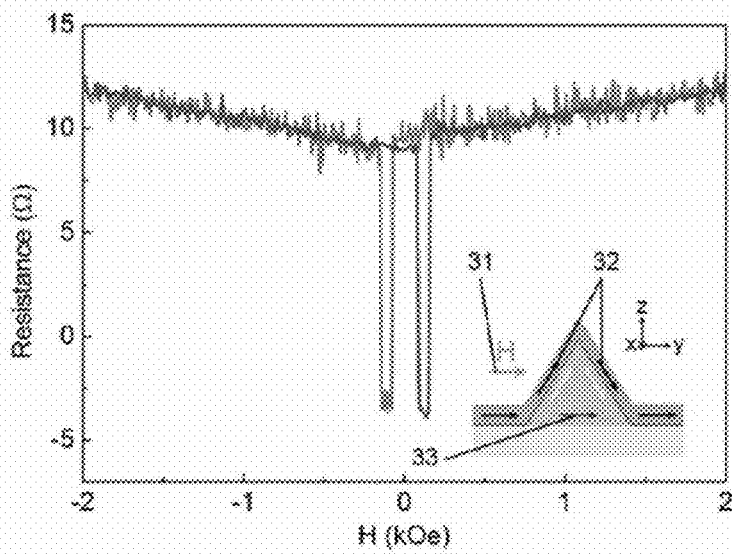
FIG. 8 is a graph showing a voltage signal measured in a Type-II spintronic device to which a magnetic field in the y-axis direction is applied.

FIG. 8 is a graph showing a voltage signal measured in a Type-II spintronic device to which a magnetic field in the y-axis direction is applied. Here, the Type-II spintronic device is the one described in the part related to FIG. 4.

It can be seen that the base voltage and the peak voltage profiles are different from those of the Type-I device of FIG. 5 in spite of the magnetic field applied in the same y-axis direction.

Although the magnetization behaviors of the magnetic bodies 12 and 13 on the transfer channel 11 under the magnetic field applied in the y axis direction are the same as shown in FIG. 3, the sizes and shapes of the measured spin voltages are different from each other. This is because the spin injection at the {112} interface, which is a close-packed plane, is easier than the spin injection at the {100} interface.

For example, in the case of a Type-I device, most of the spins are injected to the {112} interface on the left side whereas the spin injection rate on both sides of the {112} plane of the Type-II device may be the same.

Referring to the schematic cross section of the device within FIG. 8, the magnetization direction of the magnetic bodies 12 and 13 under the magnetic field 31 applied in the y-axis direction is indicated by an arrow 32 of a bold solid line. The z-axis components of the spin injected from both {112} planes have the same sizes but opposite directions and therefore disappear, and the magnetization direction 33 of the injected spins is parallel to the y-axis direction.

On the other hand, in the Type-I device, since the spin injection rate on the {112} plane on the left side is higher than the spin injection rate on the {100} plane on the right side, the magnetization direction 33 of the injected spins may be determined by the electrons injected to the {112} plane. Since they are offset, the magnetization direction of the spin electrons has both the component in the y-axis direction and the component in the z-axis direction. As a result, the spin injection rates may be different depending on the crystal planes of the interface of the single crystal transfer channel 11 which is in contact with the source/drain electrodes 12 and 13.

Figure 9:
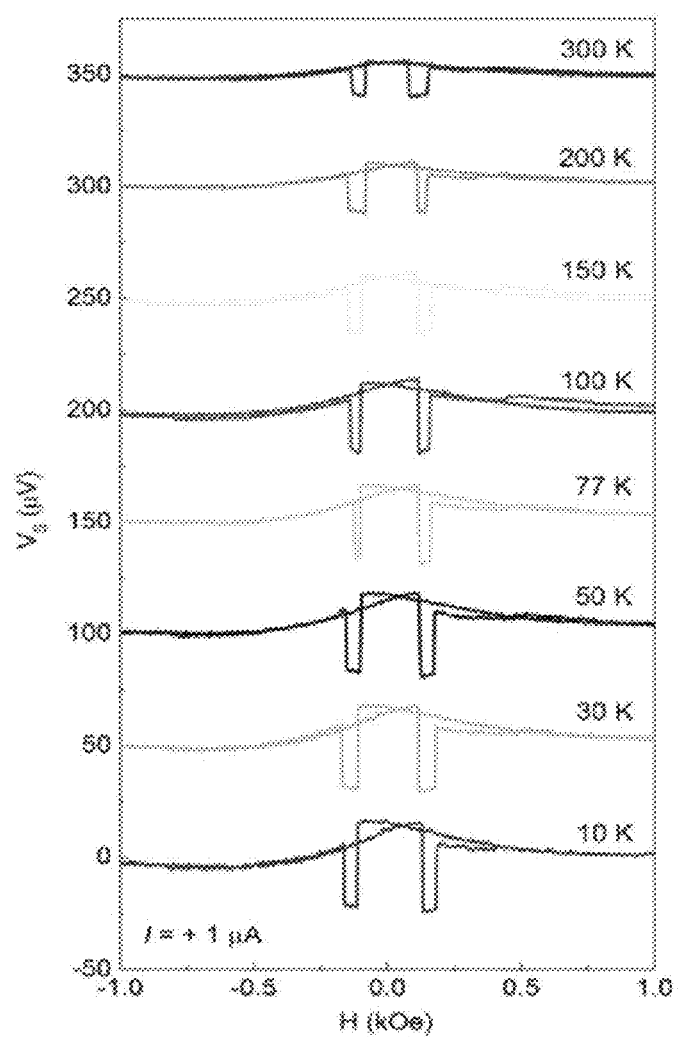
FIG. 9 is a graph showing a voltage signal measured at a temperature of about 10K to about 300K under a magnetic field applied in the y-axis direction using a Type-I spintronic device.

FIG. 9 is a graph showing a voltage signal measured at a temperature of about 10K to about 300K under a magnetic field applied in the y-axis direction using a Type-I spintronic device.

Referring to FIG. 9, it can be seen that, as the temperature increases, the magnitude of the rapid change (the recessed portion) in the spin voltage decreases but a distinct voltage signal is observed up to room temperature. The spin injection rate at room temperature was 10% or more, and also in the Type-II device the spin injection rate of 10% or more was measured.

While the present invention has been particularly shown and described with reference to embodiments thereof, the present invention should not be limited to the above embodiments. Modifications and changes can be made by a person having ordinary skill in the art without departing from the scope of the present invention. Such modifications and changes are to be regarded as being within the scope of the invention and the appended claims.

What is claimed is:

1. A spin control electronic device operable at room temperature, the device comprising:
    a transfer channel that includes a low-dimensional nanostructure, the nanostructure being located on a substrate, having a prism shape, the prism shape having an elongate shape in a first direction and having a cross section, cut along a second direction that is perpendicular to the first direction, in the shape of a triangle;
    a source electrode located on the substrate and intersecting the transfer channel, the source electrode covering part of the transfer channel; and
    a drain electrode spaced apart from the source electrode on the substrate, the drain electrode intersecting the transfer channel and covering part of the transfer channel,
    wherein electrons spin-polarized at the source electrode are injected into the transfer channel, the spin-polarized electrons reach the drain electrode through the transfer channel, and resistance differs depending on the angle the magnetization direction of the spin-polarized electrons forms with the magnetization direction of the drain electrode.

2. The device of claim 1, further comprising:
an input electrode disposed on the opposite side of the drain electrode with respect to the source electrode on the substrate, intersecting the transfer channel and covering part of the transfer channel; and
an output electrode disposed on the opposite side of the source electrode with respect to the drain electrode on the substrate, intersecting the transfer channel and covering part of the transfer channel.

3. The device of claim 1,
wherein the low-dimensional nanostructure is a nanowire comprising at least one of a Group IV semiconductor, a Group III-V compound semiconductor, a metal, and a half metal, or
wherein the low-dimensional nanostructure is a graphite-based nanostructure comprising carbon nanotubes or graphene.

4. The device of claim 1,
wherein the length of the transfer channel in the second direction is 10 nm to 1000 nm.

5. The device of claim 4,
wherein the transfer channel includes two {112} crystal planes and one {001} crystal plane.

6. The device of claim 5,
wherein the spin injection rate at the {112} crystal planes of the transfer channel is larger than the spin injection rate at the {001} crystal plane of the transfer channel.

7. The device of claim 1, further comprising:
an insulating film located between the source electrode and the transfer channel and between the drain electrode and the transfer channel, respectively.

8. The device of claim 7,
wherein the insulating film includes one or more of $Al_2O_3$, MgO, TaOx, and $SiO_2$, and the thickness of the insulating film is 0.5 nm to 3.0 nm.

9. The device of claim 1,
wherein each of the source electrode and the drain electrode includes:
at least one ferromagnetic material selected from the group consisting of CoFe, Co, CoFeB, Ni, NiFe, GaMnAs, InMnAs, GeMn, GaMnN, GaMnP, and ZnMnO, or one half metal selected from $La_{(1-x)}Sr_xMnO_3$ (LSMO) and $CrO_2$, or a Pd/CoFe multi-layer structure or a Pt/CoPt multi-layer structure.

10. The device of claim 1,
wherein each of the source electrode and the drain electrode has a rectangular shape, and
wherein the length of the source electrode in the second direction is longer than the length in the first direction, and the length of the drain electrode in the second direction is longer than the length in the first direction.

11. The device of claim 10,
wherein a length of the portion of the source electrode overlapping the transfer channel in the first direction is longer than a length in the second direction, and a length of the portion of the drain electrode overlapping the transfer channel in the first direction is longer than a length in the second direction.

12. The device of claim 11,
wherein, when an external magnetic field is applied to the spin control electronic device operable at room temperature, the magnetization direction of the portion of the source electrode overlapping the transfer channel is not parallel to the direction of the external magnetic field.

13. The device of claim 10,
wherein a distance between the source electrode and the drain electrode in the first direction is 10 nm to 5 µm.

14. The device of claim 12,
wherein the source electrode comprises a portion not overlapping the transfer channel and when the external magnetic field is applied to the spin control electronic device operable at room temperature, the magnetization direction of the portion of the source electrode not overlapping the transfer channel is parallel to the direction of the external magnetic field.

15. The device of claim 12,
wherein when the external magnetic field is applied to the spin control electronic device operable at room temperature, the magnetization direction of the portion of the source electrode overlapping the transfer channel is perpendicular to the portion of the drain electrode overlapping the transfer channel.

* * * * *